(12) United States Patent
Andreas

(10) Patent No.: US 6,387,812 B1
(45) Date of Patent: *May 14, 2002

(54) ULTRASONIC PROCESSING OF CHEMICAL MECHANICAL POLISHING SLURRIES

(75) Inventor: Michael T. Andreas, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/574,781

(22) Filed: May 19, 2000

Related U.S. Application Data

(60) Continuation of application No. 09/190,086, filed on Nov. 12, 1998, now Pat. No. 6,077,785, which is a division of application No. 08/767,163, filed on Dec. 16, 1996, now Pat. No. 5,895,550.

(51) Int. Cl.$^7$ .............................. H01L 21/302
(52) U.S. Cl. .................. 438/692; 438/693; 438/959
(58) Field of Search ................. 438/690, 959; 439/693; 156/345; 451/287, 288

(56) References Cited

U.S. PATENT DOCUMENTS

| | | | |
|---|---|---|---|
| 4,171,852 A | 10/1979 | Haentjens | 406/85 |
| 4,872,353 A | 10/1989 | Orr, Jr. et al. | 73/864.85 |
| 5,035,363 A | 7/1991 | Somoza | 241/1 |
| 5,240,552 A | 8/1993 | Yu et al. | 156/636 |
| 5,245,790 A | 9/1993 | Jerbic | 51/121 |
| 5,399,234 A * | 3/1995 | Yu et al. | 156/345 |
| 5,522,965 A | 6/1996 | Chisholm et al. | 156/636.1 |
| 5,527,423 A | 6/1996 | Neville et al. | 156/636.1 |
| 5,531,861 A * | 7/1996 | Yu et al. | 134/1 |
| 5,895,550 A * | 4/1999 | Andreas | 156/345 |
| 6,077,785 A * | 6/2000 | Andreas | 438/692 |

* cited by examiner

Primary Examiner—Benjamin L. Utech
Assistant Examiner—Kin-Chan Chen
(74) Attorney, Agent, or Firm—Kirkpatrick & Lockhart LLP

(57) ABSTRACT

The above objects and others are accomplished by a chemical mechanical polishing method and apparatus in accordance with the present invention. The apparatus includes a polishing pad having a polishing surface, and a wafer carrier for supporting a wafer disposed opposite to the polishing pad. The wafer carrier is positionable in a plane that is substantially parallel with the polishing surface, such that a surface of the wafer can be polished by contacting the polishing pad. The polishing surface and the wafer carrier are moved in parallel relative motion to mechanically abrade the wafer surface against the polishing surface in the presence of a polishing slurry. A slurry source containing the polishing slurry is connected to a slurry dispense line to dispense the slurry onto the polishing surface of the polishing pad. An acoustic energy source is positioned relative to transmit acoustic energy into the slurry to break up agglomerated particles in the slurry before the polishing slurry contacts the wafer surface. In a preferred embodiment, ultrasonic transducers are connected inline with the dispense line to provide the acoustic energy necessary to break apart the agglomerated particles in the slurry. Also the wafer carrier and the polishing pad are aligned along noncoincident parallel axes and are both rotated or translated in parallel planes to mechanically abrade the wafer surface against the polishing pad. In the practice of the invention, an acoustic energy source is positioned relative to, and preferably inline with, the dispense line and acoustic energy is generated to break up agglomerated particles in the polishing slurry, as the slurry flows through the dispense line before being dispensed onto the polishing pad.

38 Claims, 4 Drawing Sheets

ULTRASONIC PROCESSING OF CHEMICAL MECHANICAL POLISHING SLURRIES

CROSS REFERENCE TO RELATED APPLICATIONS

This application is a continuation of application Ser. No. 09/190,086, filed Nov. 12, 1998, now U.S. Pat. No. 6,077,785, which is a division of application Ser. No. 08/767,163, filed Dec. 16, 1996, now U.S. Pat. No. 5,895,550.

BACKGROUND OF THE INVENTION

1. Field of the Invention

The present invention relates to creating planar surfaces. More particularly, the present invention relates to chemical mechanical polishing apparatuses and methods employing ultrasonic processing of the polishing slurries to enhance the planarization of semiconductor substrate wafer surfaces.

2. Description of the Invention Background

Integrated circuits are typically constructed by depositing layers of predetermined materials to form circuit components on a wafer shaped semiconductor substrate. The formation of the circuit components in each layer generally produces a rough, or nonplanar, topography on the surface of the wafer. The resulting nonplanar surface must be made smooth, or planarized, to ensure a proper surface for the formation of subsequent layers of the integrated circuitry by eliminating defects in the surface that can result in flawed or improperly performing circuitry.

Planarization of the outermost surface of the wafer is performed in two ways, locally over small regions of the wafers and globally over the entire surface. Typically a layer of oxide then may be deposited over the exposed circuit layer to provide an insulating layer for the circuit and to locally planarize regions by providing a continuous layer of material. A second layer of material is then deposited on top of the insulating layer to provide a surface that can be globally planarized without damaging the underlying circuitry. The second layer is generally composed of either an oxide or a polymer. Thick oxide layers can be deposited using conventional deposition techniques. Spin coating is a commonly used technique to form the thick polymer layers on a wafer. While those techniques are useful in producing continuous uniform thickness layers, neither technique is particularly effective at producing a globally planar surface when applied to a nonplanar surface. As such, additional surface preparation is generally required prior to forming additional circuit layers on the wafer.

Methods for globally planarizing the outermost surface of the wafer include chemical etching, press planarization and chemical mechanical polishing (CMP), also referred to as chemical mechanical planarization. In chemical etching, the second layer is deposited over the preceding layers as described above and is chemically etched back to planarize the surface. The chemical etching technique is iterative in that following the etching step, if the surface was not sufficiently smooth, a new layer of polymer or oxide must be formed and subsequently etched back. This process is time consuming, lacks predictably due to iterative procedure for obtaining a planarized surface and consumes significant amounts of oxides and/or polymers in the process. In global press planarization, the second layer is planarized through the application of planar force against a planar surface that is sufficient to deform the surface of the second layer to assume a planar topography. A possible limitation to this technique is that a deformable material must be used to form the second layer.

In the CMP technique, a chemically reactive polishing slurry is used in conjunction with a polishing pad to provide a synergistic combination of chemical reactions and mechanical abrasion to planarize the surface of the second layer on the wafer. The polishing slurries used in the process are generally composed of an aqueous basic or acidic solution, such as aqueous potassium hydroxide (KOH), containing dispersed particles, such as silica or alumina. The polishing pad are typically composed of porous or fibrous materials, such as polyurethanes, that provide a somewhat compliant surface in comparison to the wafer. The polishing takes place by moving the polishing pad and/or the wafer and contacting the pad and the wafer in the presence of the polishing slurry. The wafer is polished for a period of time sufficient to achieve a desired surface finish on the layer. If the wafer is not polished for a sufficient length of time, the desired finish will not be achieved. On the other hand, if the wafer is polished for a period of time longer than necessary, the continued polishing may begin to deteriorate the surface finish. The ability to control the time required to polish the surface of the wafer can greatly improve productivity by allowing for the automation of the process, increasing the yield of properly performing wafers and a reducing the number of quality control inspections necessary to maintain the process.

A delicate balance exists in the formulations used in the CMP techniques to achieve the desired polishing effect and deviations therefrom will result in undesirable variations in the surface quality. For example, if the chemical concentration is too low, the desired chemical reactions may not proceed at an appreciable enough rate to achieve the desired polishing effect, while if the chemical concentration is too high, etching of the surface may occur. Likewise, if the particulate concentration is too low or the particle size too small, mechanical polishing will not proceed at a sufficient rate to achieve the desired polishing effect in the time provided, while if the particulate concentration is too high or the particles are too large, then the particulates will undesirably scratch the surface, instead of polishing it. The scratches that remain following polishing are often a source of variability in the performance of the finished integrated circuit resulting in problems, such as uneven interconnect metallization across a planarized surface or contamination effects due to the presence of voids or particles in the scratches.

Chemical mechanical polishing currently suffers from certain inherent problems. A first problem is that the chemicals that are needed to perform the process are relatively expensive and are generally not recyclable. It is therefore desirable to minimize the amount of chemicals used in the process to not only reduce the up front costs of purchasing and storing the chemicals, but also back end costs of waste disposal. In addition, the technique is relatively slow and time consuming. These problems are difficult to overcome without upsetting the chemical mechanical balance necessary to bring about the desired polishing effect.

In addition, CMP techniques, often experience significant performance variations over time that further complicate the automated processing of the wafers. The degradation in performance is generally attributed to the changing characteristics of the polishing pad during processing. The changes in the polishing pad result from particulates removed from the substrate during the polishing process, as well as from the slurry becoming lodged in or hardening on the surface of the pad, thereby changing the surface roughness of the pad, which is intimately associated with mechanical polishing effectiveness. Also, chemicals may become unevenly distributed in the pad resulting in variations in the chemical polishing rate. Both of these problems tend to increase the variability of the process.

Many of the prior art efforts to decrease the variability of the CMP technique have generally been directed toward overcoming the problems associated with the variability of the polishing pad. U.S. Pat. No. 5,522,965 to Chisholm et al., U.S. Pat. No. 5,399,234 to Yu, and U.S. Pat. No. 5,245,790 to Jerbic all disclose methods to improve the mechanical effectiveness and the repeatability of the polishing technique by acoustically agitating the pad-slurry-wafer interface using ultrasound to prevent or slow the accumulation of particulate matter in and on the pad. Through the use of those methods, it is hoped that the polishing pad will not have to be removed and reconditioned as often, providing not only reduced variability but increased productivity as a result of less downtime. However, a problem with these techniques are that the control over the character of the particles in the slurry occurs after the slurry has contacted and possibly scratched the surface of the wafer. While these techniques may decrease the variability in the performance of the pads in producing a given surface finish, the techniques do not serve to improve the overall quality of the surface finish.

As is evident from the aforementioned discussion, the CMP technique, while a preferred method, still has a number of difficulties in the practical application of the technique that need to be overcome. It is therefore an object of the present invention to provide a method and an apparatus for chemical mechanical polishing of the surface layer of a semiconductor wafer that overcomes many of the difficulties of current process to provide a more generally effective CMP process.

SUMMARY OF THE INVENTION

The above objects and others are accomplished by a chemical mechanical polishing method and apparatus in accordance with the present invention. The apparatus includes a polishing pad having a polishing surface, and a wafer carrier for supporting a wafer disposed opposite to the polishing pad. The wafer carrier is positionable in a plane that is substantially parallel with the polishing surface, such that a surface of the wafer can be polished by contacting the polishing pad. The polishing surface and the wafer carrier are moved in parallel relative motion to mechanically abrade the wafer surface against the polishing surface in the presence of a polishing slurry. A slurry source containing the polishing slurry is connected to a slurry dispense line to dispense the slurry onto the polishing surface of the polishing pad. An acoustic energy source is positioned to transmit acoustic energy into the slurry to break up agglomerated particles in the slurry before the polishing slurry contacts the wafer surface.

In a preferred embodiment, ultrasonic transducers are connected inline with the dispense line to provide the acoustic energy necessary to break apart the agglomerated particles in the slurry. Also, the wafer carrier and the polishing pad are aligned along noncoincident parallel axes and are both rotated or translated in parallel planes to abrade the surface of the wafer. In the practice of the invention, an acoustic energy source is positioned relative to, and preferably inline with, the dispense is line and acoustic energy is generated to break up agglomerated particles in the polishing slurry, as the slurry flows through the dispense line before being dispensed onto the polishing pad.

Accordingly, the present invention provides a method and an apparatus for chemical mechanical polishing of a semiconductor wafer surface, which overcomes problems associated with the prior art. Specifically, the applicant has found that the overall quality of the surface finish on the wafer can be increased by controlling the size of the particles in the polishing slurry prior to dispersing the polishing slurry onto the polishing pad. Whereas, the prior art methods and apparatuses have focused on reducing the variability of the finish by controlling the interface between wafer and the polishing pad. These and other details, objects, and advantages of the invention will become apparent as the following detailed description of the present preferred embodiment thereof proceeds.

BRIEF DESCRIPTION OF THE DRAWINGS

Preferred embodiments of the present invention will be described in greater detail with reference to the accompanying drawings, wherein like members bear like reference numerals and wherein.

DETAILED DESCRIPTION OF PREFERRED EMBODIMENTS

Figure 1:
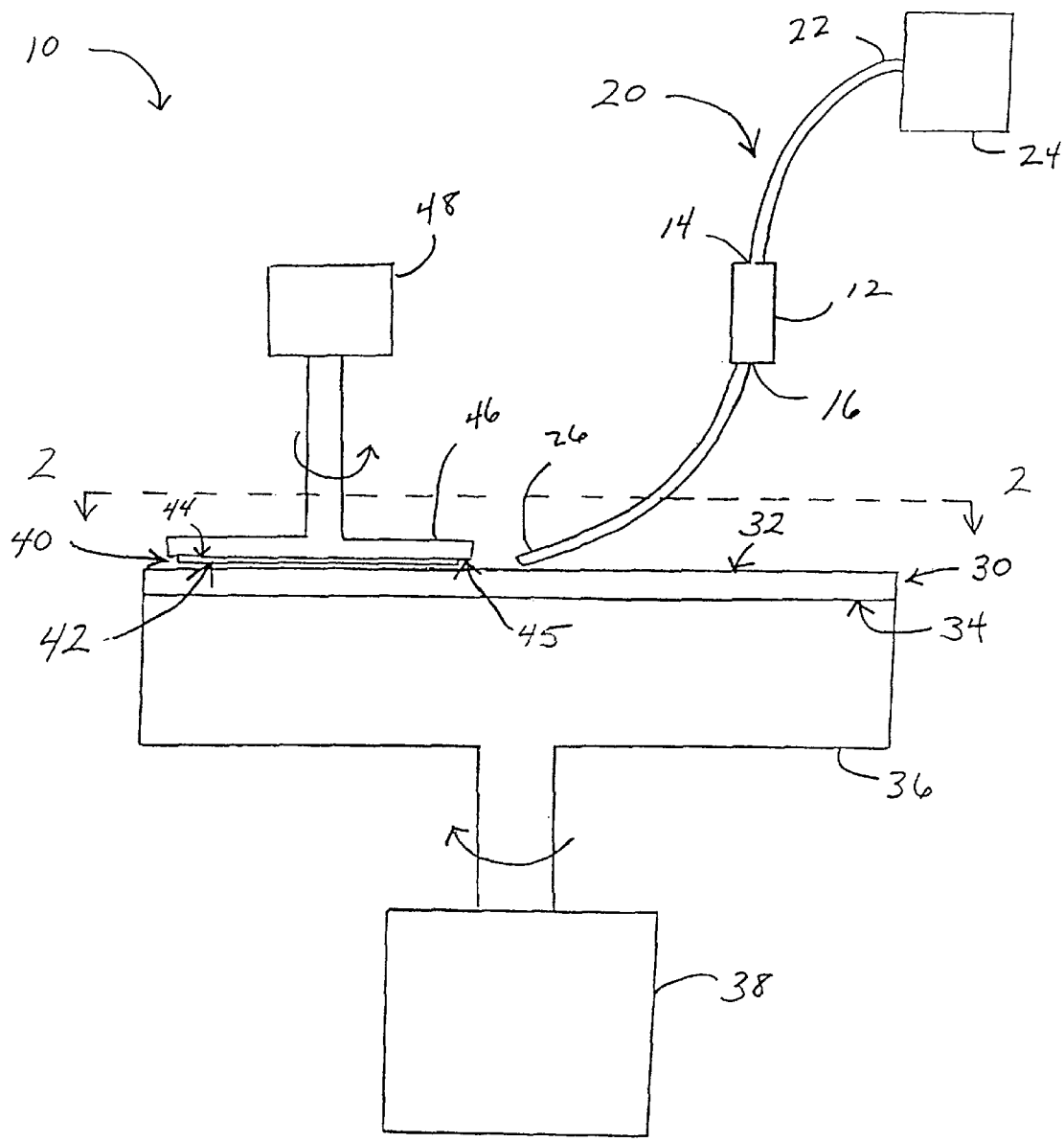
FIG. 1 is a side view of the apparatus of the present invention.
Figure 2:
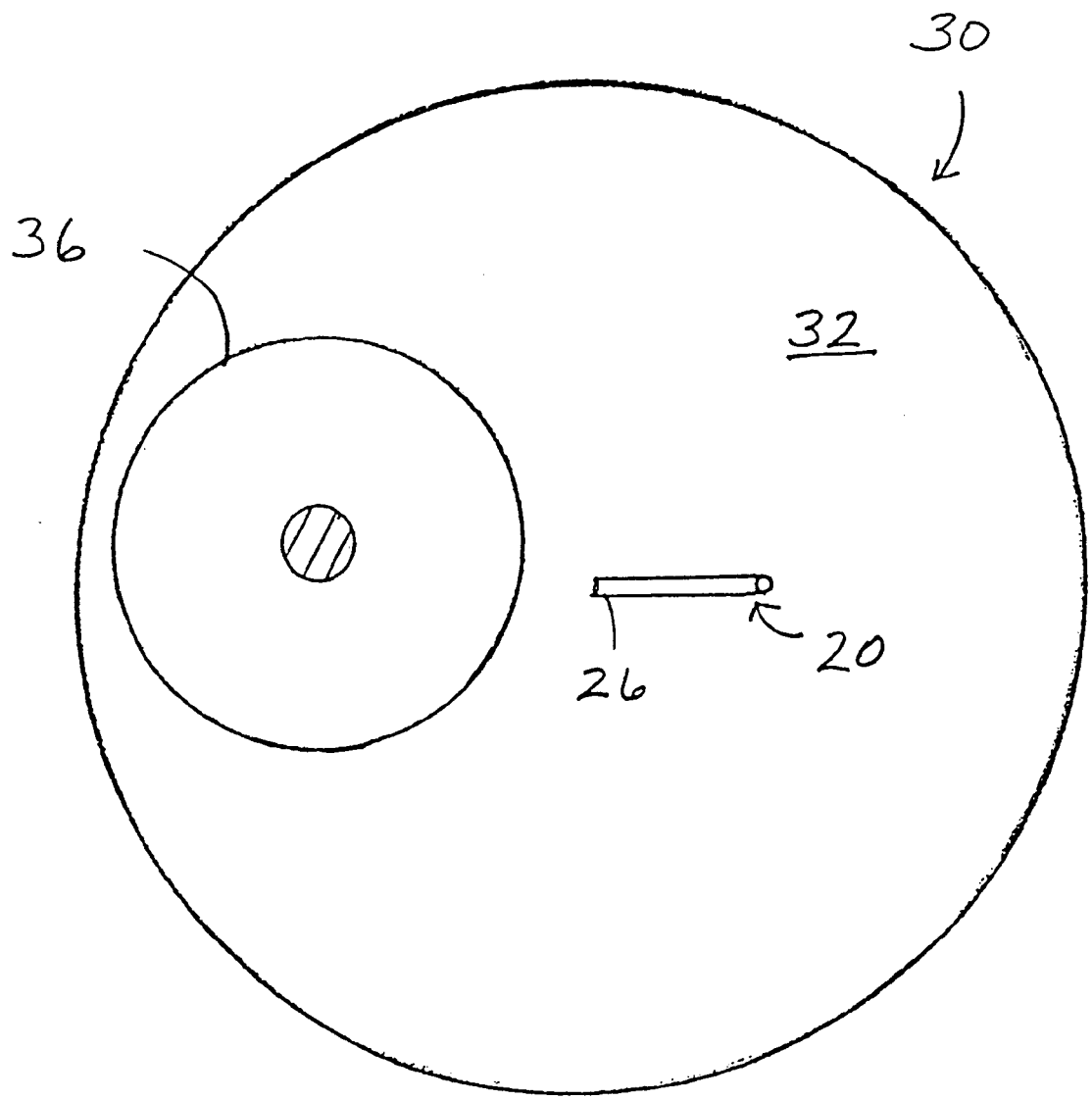
FIG. 2 is a top cross sectional view of the apparatus along the line 2'2 of FIG. 1.

The applicant has found that a significant source of variability in the quality of a finish on a surface of the wafer results from the agglomeration of polishing slurry particles in the dispense line prior to the dispensing of the slurry onto the polishing pad. The operation of the apparatus 10 will be described generally with reference to the drawings for the purpose of illustrating present preferred embodiments of the invention only and not for purposes of limiting the same. As shown in FIGS. 1 and 2, the apparatus 10 of the present invention includes an acoustic energy source 12 positioned relative to a dispense line 20 used to dispense polishing slurries onto a polishing pad 30 for polishing a wafer 40. The acoustic energy source 12 is used to break up agglomerated particles in the slurry to prevent the agglomerated particles from reaching and subsequently scratching the wafer 40.

The acoustic energy source 12 is preferably an acoustic transducer connected "inline" with the dispense line 20 as a flow through cell. The acoustic energy source 12 has an inlet 14 and an outlet 16 that are in fluid communication with the dispense line 20. For the types of particles, alumina, silica, and cerium oxide, that are used in the slurries of interest, ultrasonic transducers are preferred for use in the system. Commercially available ultrasonic transducers can be used in the present invention, such as those available from Misonix Inc. (1938 New Highway, Farmingdale, N.Y. 11735) Model Nos. XL-2015 and XL-2020, Branson Ultrasonics Corp. (41 Eagle Road, Danbury, Conn. 06813) and Sonics & Materials Inc. (West Kenosia Ave., Danbury, Conn. 06810). The flow through capacity, operating frequency and power output necessary for the transducers are dependent upon the specific application of the transducer and the types of slurries employed. The applicant has found that the frequencies in the range of 20 kHz having a maximum power output of 550 W performed satisfactorily for slurries tested, as will be discussed in more detail within. In addition, the intensity of the energy generated does not have to be constant, but can be varied or pulsed within the scope of the present invention. One skilled in the art will appreciate that the acoustic energy source 12 does not need to be "inline" with the dispense line 20 but only positioned relative to the dispense line 20 to transmit acoustic energy through the dispense line and into the slurry to break apart agglomerated particles in the slurry.

The dispense line 20 has a source end 22 attached to a slurry source 24 and a dispense end 26. In a preferred embodiment, the source end 22 is connected between the slurry source 24 and the inlet 14 of the acoustic energy source 12 and the dispense end 26 is connected to the outlet 16 of the acoustic energy source 12, as shown in FIG. 1. The dispense end 26 is positioned to dispense the slurry between the polishing pad 30 and the wafer 40. The dispense line 20 can be constructed from materials as is known in the art. The slurry is transported from the slurry source 24 through the dispense line 20 by conventional means, such as a pump (not shown).

The polishing pad 30 has a polishing surface 32 that contacts the wafer 40. The polishing pad 30 also has an opposing surface 34 that is attached to a movable/translatable platen 36. The platen 36 is attached to a platen motor 38 that is used to rotate the platen. Commercially available polishing pads 30, platens 36 and platen motors 38 can be used in the present invention. Also, the present invention does not limit the selection of the polishing pad 30, which is dependent on the surface to be polished and the type of polishing slurry to be used in the process.

The wafer 40 has a device surface 42 that is to be polished and a back surface 44 that is attached to a support surface 45 of a wafer carrier 46. The wafer carrier 46 is mounted off the centerline of the polishing pad 30, such that the wafer carrier can be brought into close proximity with the polishing surface 32 and the device surface 42 of the wafer 40 can be positioned parallel to and can be brought in contact with the polishing surface 42 or into contact via the polishing slurry. The wafer carrier 46 is preferably rotated by a carrier motor 48 in a direction opposite to the rotational direction of the polishing pad 30 and about a noncoincident parallel axis. Because the present invention modifies the slurry before it is dispensed on the pad, other types of polishers using transitional and/or orbital motions will work.

In the operation of the apparatus 10, the wafer 40 is secured in the wafer carrier 46 and the wafer carrier 46 is positioned so that the device surface 42 of the wafer 40 is directly opposed to and in close proximity to the polishing surface 32 of the polishing pad 30. The polishing slurry containing particles is pumped from the slurry source 24 into the source end 22 of the dispense line 20 where it flows through the acoustic energy source 12, which is energized to produce acoustic energy of sufficient strength to break apart agglomerated particles within the slurry. The slurry flows through the acoustic energy source 12 and is dispensed out the dispense end 26 onto the polishing surface 32 of the polishing pad 30. The polishing pad 30 and the wafer carrier 46 are rotated to mechanically abrade the device surface 42 of the wafer 40 in the presence of the polishing slurry, which also serves to lubricate the mechanical polishing and chemically attacks the device surface 42 of the wafer 40. In a preferred embodiment, both the polishing pad 30 and the wafer 40 are rotated; however, one skilled in the art will appreciate that any combination of relative rotational, orbital, or translational motion between the wafer 40 and the polishing pad 30 can be used in the present invention. The operation of the present invention is further described by way of the following examples.

EXAMPLES

A Misonix XL-2020 ultrasonic flow-through processor (550 W, 20 kHz) with a ¾" titanium horn and 800B stainless steel flow-through cell (the "sonicator") was installed in the dispense line 20 of an 8" wafer polisher to conduct scratch test experiments. Aged Rodel ILD-1300 (silica-based) and Rodel MSW-000 (alumina-based) polishing slurries were used for these tests. Aged compositions were used in the testing to ensure that sufficient agglomeration of the slurry had occurred to obtain a statistically meaningful comparison between the prior art methods and the method of the present invention. Eight inch silicon scratch test wafers with 2.4 micron boron-phosphorus-silica glass (BPSG) films were polished using the slurries flowing through the sonicator 100 ml/min, with a final buff using deionized (DI) water. The polishing conditions used are summarized in the table below:

| Polishing Parameters | | |
|---|---|---|
| Pad | Rodel IC-60 | Rodel Politex |
| Slurry Chemistry | 1) Aged Rodel ILD-1300 (silica-based) | DI Water |
| | 2) Aged Rodel MSW-1000 (alumina-based) | |
| Time | 120 sec. | 30 sec. |
| Downforce, lbs. | 9 | 3 |
| Pad Rotational Speed | 45 rpm | 10 rpm |
| Carrier Rotational Speed | 40 rpm | 10 rpm |

The power setting on the sonicator was varied from wafer to wafer, utilizing continuous operation. The delivery system was purged for 30 seconds from sample to sample at the next sonicator setting. After polishing, wafers were processed with a post-CMP clean: 30 sec 100:1 HF dip, 5 minute dump rinse, 5 minute ammonia megasonic rinse, 5 minute dump rinse and marangoni dry. Surface defects were characterized initially by Tencor Surfscan 6200 laser scanning (Tencor Instruments, 2400 Charleston Rd., Mountain View, Calif. 94042), then highlighted with titanium metallization and analyzed by KLA Instruments Corp., 160 Rio Robles, San Jose, Calif. 95161) high resolution surface scanning.

Figure 3:
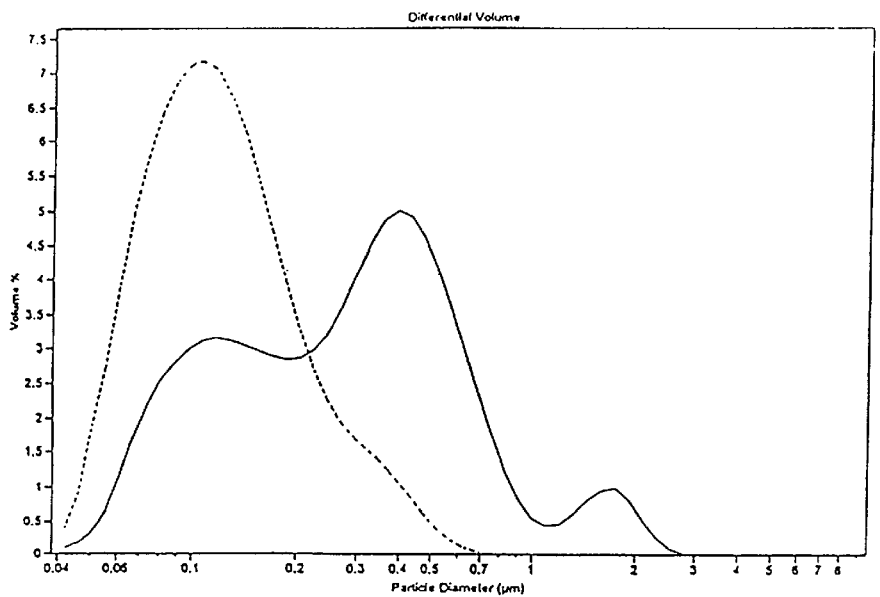
FIG. 3 is a plot of the distribution of the particle diameters of aged Rodel ILD-1300 silica-based slurry (Rodel, Inc. 451 Bellevue Rd., Newark, Del. 19713) before and after exposure to ultrasonic energy.
Figure 4:
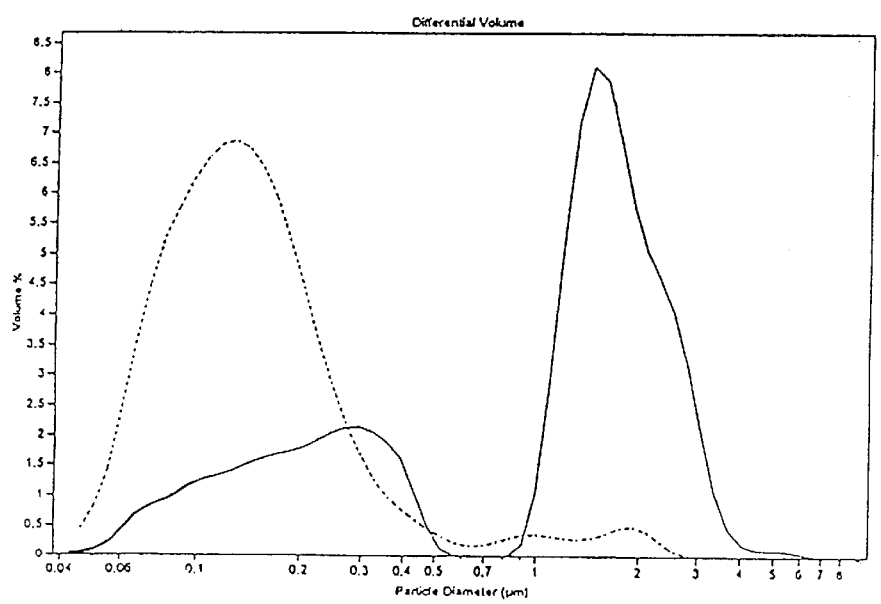
FIG. 4 is a plot of the distribution of the particle diameters of aged Rodel MSW-1000 alumina-based slurry before and after exposure to ultrasonic energy; and, FIG. 5 is a plot of the number of scratches in wafer surface following polishing with aged Rodel ILD-1300 silica-based slurry as a function of the ultrasonic energy applied to the slurry prior to polishing.

FIGS. 3 and 4 show the particle size distribution in the slurries before and after treatment using the ultrasonic processor. For comparison, benchtop analyses of ILD-1300 and MSW-1000 fresh slurries using a Microtrac X-100 Honeywell, Inc. Microtrac Products, Seattle, Wash.) indicated mean particle sizes of approximately 130 nm and 350 nm, respectively. As shown in the Figures, the inclusion of the ultrasonic transducer greatly reduces the particle size distribution of the slurries, essentially returning the mean particle size of the aged slurries to that of fresh slurries. The result of the reduced particle size distribution is a commensurate reduction (by approximately a factor of two) in the number of scratches in the wafer, as shown in FIG. 5.

Figure 5:
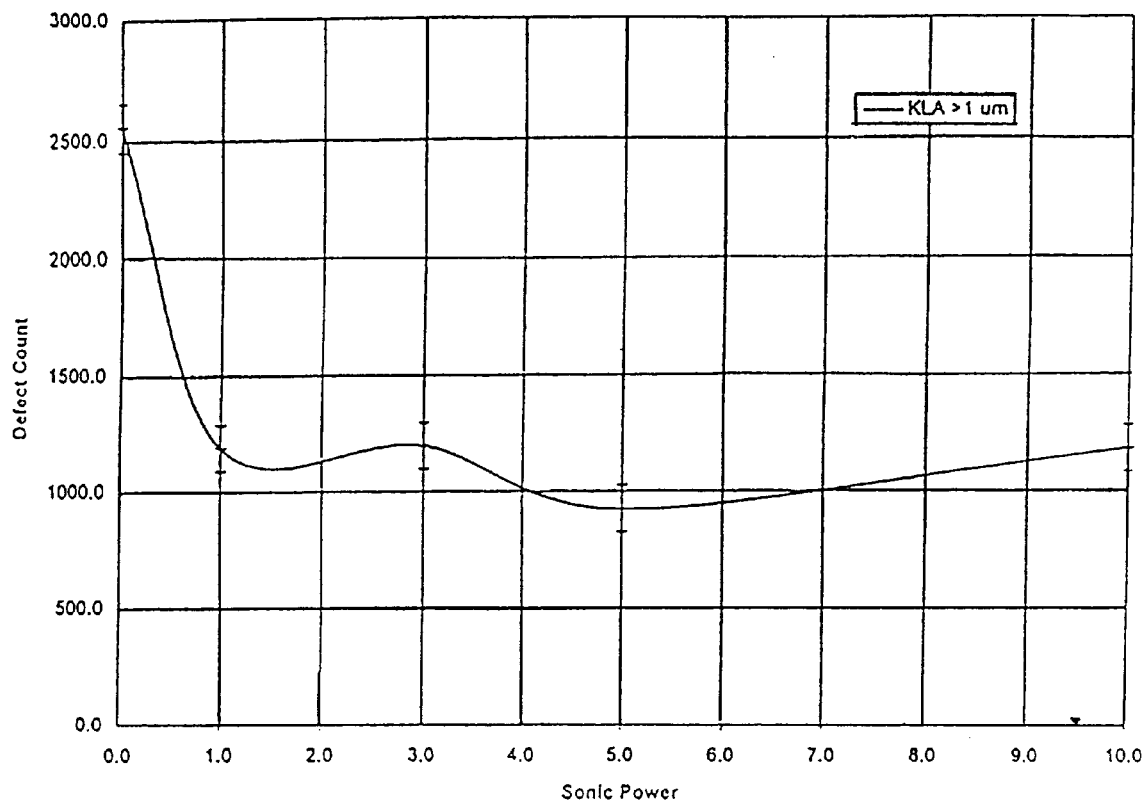

FIG. 5 also shows the number of scratches as a function of the sonicator power ranging from 0 to 250 Watts for the Rodel ILD-1300 slurry. As can be seen, the ultrasonic energy generate with an intensity of 25 Watts was sufficient to break up the agglomerated particles. While additional measurements have not been taken, it is believed that the scratches in the wafer when using the sonicator were not as deep as those scratches that were produced without the use of the sonicator due to the smaller particle sizes. Because the probability that a scratch will result in a defect fatally affecting the performance of a chip is not only a function of the number of scratches, but the extent of the scratch (depth and length); it is believed that the use of the sonicator will decrease the percentage of defective chips below the approximate factor of two based on the total number of scratches.

The samples used in the example were run in a single pass (nonrecirculating) system using a constant frequency, intensity (power), and operating time, or duty cycle, for constant slurry conditions to provide comparative data on the performance of the invention at a range of operating parameters. It will be appreciated that the slurry flow rate, particle concentrations and temperature, as well as the frequency, intensity and operating time of the acoustic energy supplied to the slurry can be varied depending upon the polishing application. A potential application using intermittent and varying frequencies and intensities of acoustic energy could be to controllably vary the particle size in the slurry during the polishing of the surface. In addition, the polishing can be performed in a recirculating slurry system in which the acoustic energy source can be intermittently operated for predetermined intervals or for intervals based on inline particle size measurement to maintain the size of the particles within a predetermined range. While the subject invention provides these and other advantages over prior art, it will be understood, however, that various changes in the details, materials and arrangements of parts and steps which have been herein described and illustrated in order to explain the nature of the invention may be made by those skilled in the art within the principle and scope of the invention as expressed in the appended claims.

What is claimed is:

1. A method of reducing particle agglomeration in a polishing slurry for polishing a semiconductor wafer surface, comprising:
    flowing the slurry through a dispense line; and
    transmitting acoustic energy of varied intensity into the dispense line, the acoustic energy having an intensity sufficient to break apart agglomerated particles in the slurry.

2. The method of claim 1, wherein the transmitting includes transmitting acoustic energy inline with the dispense line.

3. The method of claim 1, wherein the transmitting includes transmitting acoustic energy at a varying frequency.

4. The method of claim 1, wherein the transmitting includes transmitting acoustic energy at intermittent intervals.

5. A method of reducing particle agglomeration in a polishing slurry for polishing a semiconductor wafer surface, comprising:
    flowing the slurry through a dispense line; and
    intermittently transmitting acoustic energy of varied intensity into the dispense line, the acoustic energy having an intensity sufficient to break apart agglomerated particles in the slurry.

6. The method of claim 5, wherein the transmitting includes transmitting acoustic energy inline with the dispense line.

7. The method of claim 5, wherein the transmitting includes transmitting acoustic energy at a varying frequency.

8. A method of reducing particle agglomeration in a polishing slurry for polishing a semiconductor wafer surface, comprising:
    flowing the slurry through a dispense line; and
    transmitting acoustic energy of varied frequency into the dispense line, the acoustic energy having an intensity sufficient to break apart agglomerated particles in the slurry.

9. The method of claim 8, wherein the transmitting includes transmitting acoustic energy inline with the dispense line.

10. A method of reducing particle agglomeration in a polishing slurry for polishing a semiconductor wafer surface, comprising:
    flowing the slurry through a dispense line; and
    intermittently transmitting acoustic energy of varied frequency into the dispense line, the acoustic energy having an intensity sufficient to break apart agglomerated particles in the slurry.

11. The method of claim 10, wherein the transmitting includes transmitting acoustic energy inline with the dispense line.

12. A method of reducing particle agglomeration in a polishing slurry for polishing a semiconductor wafer surface, comprising:
    flowing the slurry through a dispense line; and
    intermittently transmitting acoustic energy of varied intensity from an inline energy source into the dispense line, the acoustic energy having an intensity sufficient to break apart agglomerated particles in the slurry.

13. The method of claim 12, wherein the transmitting is based upon inline particle size measurement.

14. A method of reducing particle agglomeration in a polishing slurry for polishing a semiconductor wafer surface, comprising:
    flowing the slurry through a dispense line; and
    intermittently transmitting acoustic energy of varied frequency from an inline energy source into the dispense line, the acoustic energy having an intensity sufficient to break apart agglomerated particles in the slurry.

15. The method of claim 14, wherein the transmitting is based upon inline particle size measurement.

16. A method of reducing particle agglomeration in a polishing slurry for polishing a semiconductor wafer surface, comprising:
    flowing the slurry through a dispense line; and
    intermittently transmitting acoustic energy of varied intensity and varied frequency into the dispense line to controllably vary the particle size in the slurry.

17. The method of claim 16, wherein the transmitting is based upon inline particle size measurement.

18. A method of reducing particle agglomeration in a polishing slurry for polishing a semiconductor wafer surface, comprising:
    flowing the slurry through a dispense line at a varying particle concentration; and
    intermittently transmitting acoustic energy into the dispense line from an inline energy source, the acoustic energy having an intensity sufficient to break apart agglomerated particles in the slurry.

19. The method of claim 18, wherein the transmitting is based upon inline particle size measurement.

20. A method of reducing particle agglomeration in a polishing slurry for polishing a semiconductor wafer surface, comprising:

flowing the polishing slurry through a dispense line; and transmitting ultrasonic energy into the dispense line from an inline ultrasonic transducer to break apart agglomerated particles in the slurry.

21. The method of claim 20 wherein the polishing slurry recirculates through a slurry system.

22. The method of claim 20, wherein the polishing slurry flows through the dispense line in a single pass.

23. A method of reducing particle agglomeration in a polishing slurry for polishing a semiconductor wafer surface, comprising:

flowing the slurry through a dispense line; and intermittently transmitting acoustic energy of at least one of varied frequency and intensity into the dispense line from an inline ultrasonic transducer, the acoustic energy having an intensity sufficient to break apart agglomerated particles in the slurry.

24. The method of claim 23, wherein the ultrasonic transducer generates ultrasonic energy having a frequency of 15–30 kHz.

25. The method of claim 23, wherein the ultrasonic transducer is operated at a power of at least 25 watts.

26. The method of claim 23, wherein the ultrasonic transducer is operated at a power of at least 25–250 watts.

27. A method of reducing particle agglomeration in a polishing slurry for polishing a semiconductor wafer surface, comprising:

flowing the slurry through a dispense line at a varying particle concentration; and intermittently transmitting acoustic energy into the dispense line of at least one of varied frequency and intensity from an inline ultrasonic transducer, the acoustic energy having an intensity sufficient to break apart agglomerated particles in the slurry.

28. A method of reducing particle agglomeration in a polishing slurry for polishing a semiconductor wafer surface, comprising:

flowing the slurry through a dispense line at a constant slurry flow rate; and transmitting acoustic energy into the dispense line, the acoustic energy having an intensity sufficient to break apart agglomerated particles in the slurry.

29. The method of claim 28, wherein the slurry flow rate is 100 ml/min.

30. A method of reducing particle agglomeration in a polishing slurry for polishing a semiconductor wafer surface, comprising:

flowing the slurry through a dispense line at a varying slurry flow rate; and transmitting acoustic energy into the dispense line, the acoustic energy having an intensity sufficient to break apart agglomerated particles in the slurry.

31. A method of reducing particle agglomeration in a polishing slurry for polishing a semiconductor wafer surface, comprising:

flowing the slurry through a dispense line at a constant particle concentration; and transmitting acoustic energy into the dispense line, the acoustic energy having an intensity sufficient to break apart agglomerated particles in the slurry.

32. The method of claim 31, wherein the particles are selected from the group consisting of alumina, silica and cerium oxide.

33. A method of reducing particle agglomeration in a polishing slurry for polishing a semiconductor wafer surface, comprising:

flowing the slurry through a dispense line at a varying particle concentration; and transmitting acoustic energy into the dispense line, the acoustic energy having an intensity sufficient to break apart agglomerated particles in the slurry.

34. The method of claim 33, wherein the particles are selected from the group consisting of alumina, silica and cerium oxide.

35. A method of reducing particle agglomeration in a polishing slurry for polishing a semiconductor wafer surface, comprising:

flowing the slurry through a dispense line at a constant particle concentration; and intermittently transmitting acoustic energy into the dispense line, the acoustic energy having an intensity sufficient to break apart agglomerated particles in the slurry.

36. A method of reducing particle agglomeration in a polishing slurry for polishing a semiconductor wafer surface, comprising:

flowing the slurry through a dispense line at a varying particle concentration; and intermittently transmitting acoustic energy into the dispense line, the acoustic energy having an intensity sufficient to break apart agglomerated particles in the slurry.

37. A method of reducing particle agglomeration in a polishing slurry for polishing a semiconductor wafer surface, comprising:

flowing the slurry through a dispense line at a constant slurry temperature; and transmitting acoustic energy into the dispense line, the acoustic energy having an intensity sufficient to break apart agglomerated particles in the slurry.

38. A method of reducing particle agglomeration in a polishing slurry for polishing a semiconductor wafer surface, comprising:

flowing the slurry through a dispense line at a varying slurry temperature; and transmitting acoustic energy into the dispense line, the acoustic energy having an intensity sufficient to break apart agglomerated particles in the slurry.

* * * * *

UNITED STATES PATENT AND TRADEMARK OFFICE
CERTIFICATE OF CORRECTION

PATENT NO.   : 6,387,812 B1
DATED        : May 14, 2002
INVENTOR(S)  : Michael T. Andreas It is certified that error appears in the above-identified patent and that said Letters Patent is hereby corrected as shown below:

Column 3,
Line 62, please delete the word "is" after the word "dispense".

Column 5,
Lines 49-50, delete "transitional" and replace it with -- translational --.

Signed and Sealed this

Twelfth Day of November, 2002

Attest:

Attesting Officer

JAMES E. ROGAN
Director of the United States Patent and Trademark Office